US012197003B2

(12) United States Patent
Hiratani et al.

(10) Patent No.: US 12,197,003 B2
(45) Date of Patent: Jan. 14, 2025

(54) OPTICAL FILTER AND WAVELENGTH TUNABLE LASER ELEMENT

(71) Applicants: Sumitomo Electric Industries, Ltd., Osaka (JP); National University Corporation Hokkaido University, Sapporo (JP)

(72) Inventors: Takuo Hiratani, Osaka (JP); Naoki Fujiwara, Osaka (JP); Kunimasa Saitoh, Sapporo (JP); Takeshi Fujisawa, Sapporo (JP); Takanori Sato, Sapporo (JP)

(73) Assignees: Sumitomo Electric Industries, Ltd., Osaka (JP); National University Corporation Hokkaido University, Sapporo (JP)

( * ) Notice: Subject to any disclaimer, the term of this patent is extended or adjusted under 35 U.S.C. 154(b) by 311 days.

(21) Appl. No.: 17/942,612

(22) Filed: Sep. 12, 2022

(65) Prior Publication Data

US 2023/0089696 A1 Mar. 23, 2023

(30) Foreign Application Priority Data

Sep. 17, 2021 (JP) ................... 2021-151713

(51) Int. Cl.
*G02B 6/12* (2006.01)
*G02B 5/20* (2006.01)
(Continued)

(52) U.S. Cl.
CPC ......... *G02B 6/12007* (2013.01); *G02B 5/208* (2013.01); *H01S 5/021* (2013.01);
(Continued)

(58) Field of Classification Search
CPC ............ G02B 6/29347; G02B 6/29343; G02B 6/29338; G02B 6/12007; H01S 5/021;
(Continued)

(56) References Cited

U.S. PATENT DOCUMENTS 5,903,691 A * 5/1999 Wisseman ......... G02B 6/29334
385/11
7,149,381 B2 * 12/2006 Margalit ................. H01S 5/141
385/39
(Continued)

FOREIGN PATENT DOCUMENTS

| CN | 106301382 A | * | 1/2017 | |
| JP | 2010087472 A | * | 4/2010 | ............ H01S 5/141 |
| TW | 546496 B1 | * | 8/2016 | |

OTHER PUBLICATIONS

Chaiwat Sirawattananon et al., "Analytical Vernier Effects of a PANDA Ring Resonator for Microforce Sensing Application", IEEE Transactions on Nanotechnology, vol. 11, No. 4, pp. 707-712, Jul. 2012 (Year: 2012).*

(Continued)

*Primary Examiner* — Michelle R Connelly
*Assistant Examiner* — Darby M. Thomason
(74) *Attorney, Agent, or Firm* — Volpe Koenig (57) ABSTRACT

An optical filter includes a first loop mirror, a second loop mirror, a first waveguide optically coupled to the first loop mirror and the second loop mirror, a second waveguide optically coupled to the first loop mirror and the second loop mirror, a first access waveguide optically coupled to the first waveguide, a second access waveguide optically coupled to the second waveguide, and an output section, wherein the first loop mirror includes a first loop waveguide and a first multiplexer/demultiplexer, the second loop mirror includes a second loop waveguide and a second multiplexer/demultiplexer, the output section includes a third loop waveguide,
(Continued)

a third multiplexer/demultiplexer, a third waveguide, and a fourth waveguide, the third loop waveguide optically coupled to the second loop waveguide and the third multiplexer/demultiplexer, the third waveguide and the fourth waveguide optically coupled to the third multiplexer/demultiplexer, and the output section.

7 Claims, 7 Drawing Sheets

(51) Int. Cl.
*H01S 5/02* (2006.01)
*H01S 5/026* (2006.01)
*H01S 5/14* (2006.01)
*G02B 5/26* (2006.01)
*G02B 6/293* (2006.01)
*H01S 5/042* (2006.01)
*H01S 5/22* (2006.01)

(52) U.S. Cl.
CPC .............. *H01S 5/026* (2013.01); *H01S 5/142* (2013.01); *G02B 5/26* (2013.01); *G02B 6/29338* (2013.01); *G02B 6/29347* (2013.01); *H01S 5/04252* (2019.08); *H01S 5/22* (2013.01)

(58) Field of Classification Search
CPC .......... H01S 5/22; H01S 5/1032; H01S 5/142; H01S 5/026; H01S 5/0612; H01S 5/083; H01S 5/0085; H01S 5/1092; H01S 5/04252; H01S 5/227; H01S 5/06246; H01S 3/08; H01S 3/08027; H01S 3/10053; H01S 3/082; H01S 3/0813; H01S 3/0816; G02F 1/3519; G01J 3/4532; H01L 31/02327; H04J 14/083
See application file for complete search history.

(56) References Cited

U.S. PATENT DOCUMENTS

| 8,467,121 | B2* | 6/2013 | Bogoni ..................... G02F 3/00 |
| | | | 385/32 |
| 2016/0013609 | A1* | 1/2016 | Doerr .................... H01S 5/4062 |
| | | | 372/9 |
| 2018/0159294 | A1* | 6/2018 | Bovington ............. H04L 12/64 |
| 2021/0159659 | A1* | 5/2021 | Bandyopadhyay ......................... |
| | | | H01S 3/094053 |
| 2021/0184774 | A1* | 6/2021 | Zhou ....................... G02F 1/225 |

OTHER PUBLICATIONS

Muhammad Safwan Aziz et al., "Trapping of gold nanoparticle and polystyrene beads by dynamic optical tweezers", Jurnal Teknologi (Sciences & Engineering), vol. 74, No. 8, pp. 95-100 (Year: 2015).*
Ang Li et al., "A simple and novel method to obtain an FSR free silicon ring resonator", Proc. of SPIE vol. 9891, No. 989115, pp. 1-7, 2016 (Year: 2016).*
Yongkang Gao et al., "High-Power, Narrow-Linewidth, Miniaturized Silicon Photonic Tunable Laser With Accurate Frequency Control", Journal of Lightwave Technology, vol. 38, No. 2, pp. 265-271, Jan. 15, 2020.

* cited by examiner

OPTICAL FILTER AND WAVELENGTH TUNABLE LASER ELEMENT

CROSS REFERENCE TO RELATED APPLICATIONS

This application claims priority based on Japanese Patent Application No. 2021-151713 filed on Sep. 17, 2021, and the entire contents of the Japanese patent application are incorporated herein by reference.

TECHNICAL FIELD

The present disclosure relates to optical filters and wavelength tunable laser elements.

BACKGROUND

There has been known a wavelength tunable laser element having a gain section and a filter for reflecting light. The light emitted from the gain section is reflected by the filter to cause laser oscillation. There is a technique of forming a filter with two ring resonators (for example, [Non-PTL1] "High-Power, Narrow-Linewidth, Miniaturized Silicon Photonic Tunable Laser With Accurate Frequency Control" Y. Gao et. al. Journal of Lightwave Technology, vol. 38, No. 2, Jan. 15, 2020 p 265-271).

SUMMARY

An optical filter according to the present disclosure includes a first loop mirror, a second loop mirror, a first waveguide optically coupled to the first loop mirror and the second loop mirror, a second waveguide optically coupled to the first loop mirror and the second loop mirror, a first access waveguide optically coupled to the first waveguide, a second access waveguide optically coupled to the second waveguide, and an output section. The first loop mirror includes a first loop waveguide and a first multiplexer/demultiplexer. The second loop mirror includes a second loop waveguide and a second multiplexer/demultiplexer. The first loop waveguide is optically coupled to the first multiplexer/demultiplexer. The second loop waveguide is optically coupled to the second multiplexer/demultiplexer. The first waveguide is optically coupled to the first multiplexer/demultiplexer and the second multiplexer/demultiplexer. The second waveguide is optically coupled to the first multiplexer/demultiplexer and the second multiplexer/demultiplexer. The output section includes a third loop waveguide, a third multiplexer/demultiplexer, a third waveguide, and a fourth waveguide. The third loop waveguide is optically coupled to the second loop waveguide and the third multiplexer/demultiplexer. The third waveguide and the fourth waveguide are optically coupled to the third multiplexer/demultiplexer.

A wavelength tunable laser element according to the present disclosure includes a gain section having an optical gain, the optical filter described above, and a reflector configured to reflect light. The gain section is positioned between the optical filter and the reflector and is optically coupled to a first access waveguide of the optical filter.

DETAILED DESCRIPTION

When the characteristics of the optical filter cannot be measured during the operation of the wavelength tunable laser element, it is difficult to accurately control the characteristics of the optical filter. Therefore, the oscillation wavelength of the wavelength tunable laser element becomes unstable.

DESCRIPTION OF EMBODIMENTS OF PRESENT DISCLOSURE

First, the contents of the embodiments of the present disclosure will be listed and explained.

(1) An optical filter according to an aspect of the present disclosure includes a first loop mirror, a second loop mirror, a first waveguide optically coupled to the first loop mirror and the second loop mirror, a second waveguide optically coupled to the first loop mirror and the second loop mirror, a first access waveguide optically coupled to the first waveguide, a second access waveguide optically coupled to the second waveguide, and an output section. The first loop mirror includes a first loop waveguide and a first multiplexer/demultiplexer. The second loop mirror includes a second loop waveguide and a second multiplexer/demultiplexer. The first loop waveguide is optically coupled to the first multiplexer/demultiplexer. The second loop waveguide is optically coupled to the second multiplexer/demultiplexer. The first waveguide is optically coupled to the first multiplexer/demultiplexer and the second multiplexer/demultiplexer. The second waveguide is optically coupled to the first multiplexer/demultiplexer and the second multiplexer/demultiplexer. The output section includes a third loop waveguide, a third multiplexer/demultiplexer, a third waveguide, and a fourth waveguide. The third loop waveguide is optically coupled to the second loop waveguide and the third multiplexer/demultiplexer. The third waveguide and the fourth waveguide are optically coupled to the third multiplexer/demultiplexer. When light is incident on the first access waveguide and the second access waveguide, resonance modes are excited in the first loop mirror and the second loop mirror. Light having the resonant wavelength is transferred from the second loop waveguide to the third loop waveguide of the output section. The light propagating through the third loop waveguide is emitted from the third waveguide and the fourth waveguide. The light emitted from the third waveguide and fourth waveguide has a high intensity at the resonant wavelength. The emitted light can be used to measure the characteristics of the optical filter.

(2) The output section may include a fourth multiplexer/demultiplexer. The fourth multiplexer/demultiplexer may be optically coupled to the second loop waveguide and the third loop waveguide. From the third multiplexer/demultiplexer to the fourth multiplexer/demultiplexer, an optical path length of the third loop waveguide in a clockwise direction of the third loop waveguide may be equal to an optical path length of the third loop waveguide in a counterclockwise direction of the third loop waveguide. The phases of the light propagating through the third loop waveguide match each other. One of the two resonance modes can be emitted from the third waveguide and the other can be emitted from the fourth waveguide.

(3) From the second multiplexer/demultiplexer to the fourth multiplexer/demultiplexer, an optical path length of the second loop waveguide in a clockwise direction of the second loop waveguide may be equal to an optical path length of the second loop waveguide in a counterclockwise direction of the second loop waveguide. The phases of the light propagating through the third loop waveguide match each other. One of the two resonance modes can be emitted from the third waveguide and the other can be emitted from the fourth waveguide.

(4) A shape of the first multiplexer/demultiplexer is symmetrical, a shape of the second multiplexer/demultiplexer may be symmetrical, a shape of the third multiplexer/demultiplexer may be symmetrical, and a shape of the first waveguide and a shape of the second waveguide are symmetrical to each other. The resonant wavelengths of the two resonance modes are equal to each other. FSRs of the two resonance modes are equal to each other. The characteristics of the optical filter can be measured by measuring the resonant wavelength and the FSR of one of the two resonance modes.

(5) The first waveguide, the second waveguide, the third waveguide, the fourth waveguide, the first loop waveguide, the second loop waveguide, the third loop waveguide, the first access waveguide, and the second access waveguide may be made of silicon. The loss of light can be suppressed.

(6) The optical filter may include a phase adjusting section disposed in at least one of the first loop waveguide and the second loop waveguide, the phase adjusting section being configured to adjust a phase of light propagating in the at least one of the first loop waveguide and the second loop waveguide. The wavelength of the light can be changed by adjusting the phase of the light.

(7) A wavelength tunable laser element includes a gain section having an optical gain, the optical filter and a reflector configured to reflect light. The gain section is positioned between the optical filter and the reflector and is optically coupled to the first access waveguide of the optical filter. The emitted light from the gain section is reflected by the optical filter and the reflector. The wavelength tunable laser element cause laser oscillation. A part of the laser light is transferred to the output section and emitted from the third waveguide of the output section. The characteristics of the optical filter may be measured using light emitted from the fourth waveguide of the output section. The oscillation wavelength of the laser light can be controlled.

DETAILS OF EMBODIMENTS OF PRESENT DISCLOSURE

Specific examples of an optical filter and a wavelength tunable laser element according to embodiments of the present disclosure will be described below with reference to the drawings. It should be noted that the present disclosure is not limited to these examples, but is defined by the scope of claims, and is intended to include all modifications within the meaning and range equivalent to the scope of claims.

First Embodiment

Figure 1:
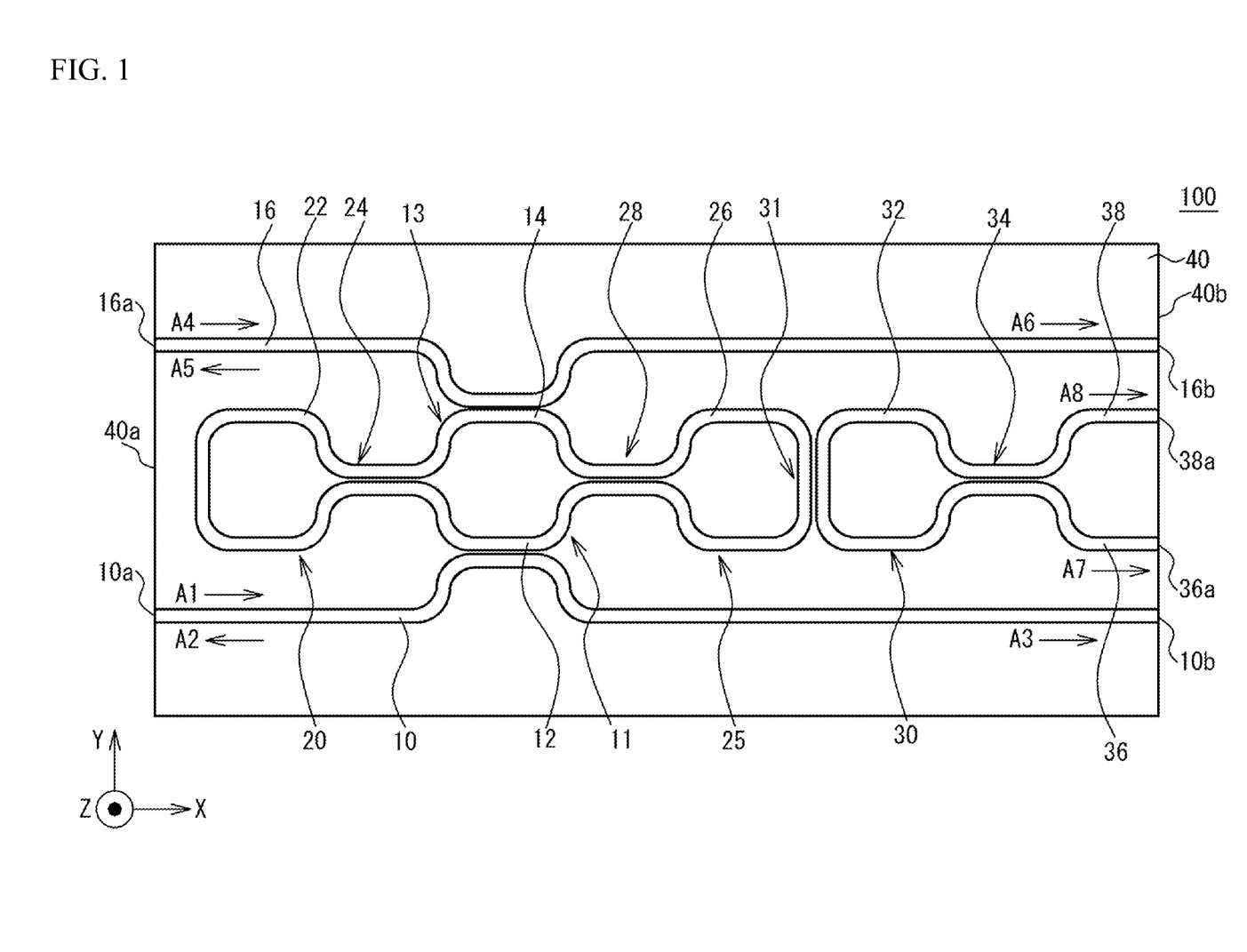
FIG. 1 is a plan view illustrating an optical filter according to first embodiment.

FIG. 1 is a plan view illustrating an optical filter 100 according to a first embodiment. The X axis illustrated in FIG. 1 is orthogonal to the Y axis. The Z-axis is orthogonal to the X-axis and the Y-axis. As illustrated in FIG. 1, optical filter 100 includes an access waveguide 10 (first access waveguide), a waveguide 12 (first waveguide), a waveguide 14 (second waveguide), an access waveguide 16 (second access waveguide), a loop mirror 20 (first loop mirror), a loop mirror 25 (second loop mirror), and an output section 30.

Access waveguide 10, access waveguide 16, waveguide 12, waveguide 14, loop mirror 20, loop mirror 25, and output section 30 are disposed on a substrate 40. The upper surface of substrate 40 extends in an XY plane. Substrate 40 has a rectangular shape in the XY plane. Two sides of substrate 40 extend along the X-axis. Two sides of substrate 40 extend along the Y-axis. Substrate 40 has a thickness along the Z-axis. Substrate 40 has an end portion 40a and an end portion 40b. End portion 40a is one of two sides (end portions of substrate 40) extending along the Y-axis of substrate 40. End portion 40b is the other of the two sides extending along the Y-axis of substrate 40 (end portion of substrate 40).

Loop mirror 20 and loop mirror 25 are arranged along the X axis. Loop mirror 20 is positioned in a region close to end portion 40a. Loop mirror 25 is positioned in a region close to end portion 40b.

Loop mirror 20 includes a loop waveguide 22 (first loop waveguide) and a multiplexer/demultiplexer 24 (first multiplexer/demultiplexer). Loop mirror 25 includes a loop waveguide 26 (second loop waveguide) and a multiplexer/demultiplexer 28 (second multiplexer/demultiplexer). Each of loop waveguide 22 and loop waveguide 26 is a loop-shaped optical waveguide. When light is input to the input terminal of multiplexer/demultiplexer 24, loop mirror 20 reflects the light to the input terminal of multiplexer/demultiplexer 24. When light is input to the input terminal of multiplexer/demultiplexer 28, loop mirror 25 reflects the light to the input terminal of multiplexer/demultiplexer 28.

Multiplexer/demultiplexer 24 and multiplexer/demultiplexer 28 are, for example, 3 dB couplers. Multiplexer/demultiplexer 24 and multiplexer/demultiplexer 28 in the example of FIG. 1 are directional couplers. In a directional coupler, two optical waveguides are close to each other to a distance of about the wavelength of propagating light. A power coupling coefficient of each of multiplexer/demultiplexer 24 and multiplexer/demultiplexer 28 is 0.5. As the multiplexer/demultiplexer, a two input two output (2×2) multi-mode interference waveguide (MMI) may be used instead of the directional coupler. Loop waveguide 22 is optically coupled to multiplexer/demultiplexer 24. Loop waveguide 26 is optically coupled to multiplexer/demultiplexer 28.

Waveguide 12 and waveguide 14 extend along the X-axis. Waveguide 12 and waveguide 14 are positioned between loop mirror 20 and loop mirror 25. Waveguide 12 and waveguide 14 are connected to loop mirror 20 and loop mirror 25. Waveguide 12 and waveguide 14 overlap each other with respect to a straight line parallel to the X-axis and passing through an intermediate point between waveguide 12 and waveguide 14. That is, waveguide 12 and waveguide 14 are symmetrical to each other.

Waveguide 12 is curved to approach multiplexer/demultiplexer 24 and multiplexer/demultiplexer 28. Waveguide 12 is optically coupled to multiplexer/demultiplexer 24 and multiplexer/demultiplexer 28. Waveguide 14 is curved to approach multiplexer/demultiplexer 24 and multiplexer/demultiplexer 28. Waveguide 14 is optically coupled to multiplexer/demultiplexer 24 and multiplexer/demultiplexer 28. More specifically, a first end portion of waveguide 12 is optically coupled to multiplexer/demultiplexer 24. A second end portion of waveguide 12 is optically coupled to multiplexer/demultiplexer 28. A first end portion of waveguide 14 is optically coupled to multiplexer/demultiplexer 24. A second end portion of waveguide 14 is optically coupled to multiplexer/demultiplexer 28. Loop mirror 20, loop mirror 25 and waveguide 12 constitute a resonator 11. Loop mirror 20, loop mirror 25, and waveguide 14 constitute a resonator 13. An example of a configuration of an optical waveguide of optical filter 100 will be described in a second embodiment.

Access waveguide 10, waveguide 12, waveguide 14, and access waveguide 16 are arranged in this order along the Y-axis. Access waveguide 10 extends along the X-axis. Access waveguide 10 is curved to approach waveguide 12. Access waveguide 10 is separated from waveguide 12 by a distance of, for example, several hundred nm. Access waveguide 10 is optically coupled to waveguide 12. Access waveguide 16 extends along the X-axis. Access waveguide 16 is curved to approach waveguide 14. Access waveguide 16 is separated from waveguide 14 by a distance of, for example, several hundred nm. Access waveguide 16 is optically coupled to waveguide 14.

An end portion 10a of access waveguide 10 and an end portion 16a of access waveguide 16 are positioned at end portion 40a. The other end portion 10b of access waveguide 10 and the other end portion 16b of access waveguide 16 are positioned at end portion 40b.

Output section 30 is positioned between loop waveguide 26 of loop mirror 25 and end portion 40b. Output section 30 includes a multiplexer/demultiplexer 31 (third multiplexer/demultiplexer), a loop waveguide 32 (third loop waveguide), a multiplexer/demultiplexer 34 (fourth multiplexer/demultiplexer), a waveguide 36 (third waveguide), and a waveguide 38 (fourth waveguide). Multiplexer/demultiplexer 31 is, for example, a directional coupler. The power coupling efficiency can be properly determined according to the desired extraction efficiency. Multiplexer/demultiplexer 34 is a 3 dB coupler. Multiplexer/demultiplexer 34 is, for example, a directional coupler. A power coupling coefficient of multiplexer/demultiplexer 34 is 0.5.

Loop waveguide 32 is a loop-shaped optical waveguide. Loop waveguide 32 is positioned next to loop waveguide 26. Loop waveguide 32 is optically coupled to loop waveguide 26. More specifically, the directional coupler (multiplexer/demultiplexer 31) is formed by bringing loop waveguide 32 and loop waveguide 26 close to each other to about the wavelength of light. Loop waveguide 32 is optically coupled to multiplexer/demultiplexer 34.

Waveguide 36 and waveguide 38 are arranged along the Y-axis. Waveguide 36 and waveguide 38 are positioned between loop waveguide 32 and end portion 40b. Waveguide 36 and waveguide 38 are optically coupled to multiplexer/demultiplexer 34. Waveguide 36 and waveguide 38 extend along the X-axis from multiplexer/demultiplexer 34 toward end portion 40b. An end portion 36a of waveguide 36 and an end portion 38a of waveguide 38 are positioned at end portion 40b. Output section 30 may be optically coupled to loop waveguide 22 of loop mirror 20.

One of end portion 10a and end portion 10b (for example, end portion 10a) is an incident port of optical filter 100. One of end portion 16a and end portion 16b (for example, end portion 16a) is an incident port of optical filter 100. End portion 36a and end portion 38a are output ports of optical filter 100.

As indicated by an arrow A1 in FIG. 1, when light is incident on access waveguide 10 through end portion 10a from an unillustrated light source located outside optical filter 100, a resonance mode is excited in resonator 11. Light having a resonant wavelength is transferred from loop waveguide 26 to loop waveguide 32. The light propagates through waveguide 36. The light is emitted from end portion 36a to the outside of optical filter 100 as indicated by an arrow A7. When light is incident on access waveguide 16 from end portion 16a as indicated by an arrow A4, a resonance mode is excited in resonator 13. Light having the resonant wavelength is transferred from loop waveguide 26 to loop waveguide 32 of output section 30. The light propagates through waveguide 38. The light is emitted from end portion 38a to the outside of optical filter 100 as indicated by an arrow A8.

More specifically, the light incident from end portion 10a propagates through access waveguide 10. Light is transferred from access waveguide 10 to waveguide 12. Light propagating through waveguide 12 is input to multiplexer/demultiplexer 24 and multiplexer/demultiplexer 28. Light is distributed from waveguide 12 through multiplexer/demultiplexer 24 to both ends of loop waveguide 22. The intensity of the distributed light is 1:1. The phases of these lights are shifted with each other by $\pi/2$. The phase of the light propagating counterclockwise in loop waveguide 22 is delayed by $\pi/2$ with respect to the phase of the light propagating clockwise.

The light propagating counterclockwise in loop waveguide 22 is distributed through multiplexer/demultiplexer 24 to waveguide 12 without phase change and to waveguide 14 with a phase delay of $\pi/2$. The light propagating clockwise in loop waveguide 22 is distributed through multiplexer/demultiplexer 24 to waveguide 12 with a phase delay of $\pi/2$ and to waveguide 14 without phase change. The light that propagates clockwise through loop waveguide 22 and is input to waveguide 14 and the light that propagates counterclockwise through loop waveguide 22 and is input to waveguide 14 have opposite phases. These lights cancel each other out. The light propagated counterclockwise through loop waveguide 22 and input to waveguide 12 and the light propagated clockwise through loop waveguide 22 and input to waveguide 12 are in the same phase. These lights are multiplexed without cancelling each other.

Light is distributed from waveguide 12 through multiplexer/demultiplexer 28 to both ends of loop waveguide 26. The light that propagates clockwise through loop waveguide 26 and is input to waveguide 14 and the light that propagates counterclockwise through loop waveguide 26 and is input to waveguide 14 have opposite phases. These lights cancel each other out. The light propagated counterclockwise through loop waveguide 26 and input to waveguide 12 and the light propagated clockwise through loop waveguide 26 and input to waveguide 12 are in the same phase. These lights are multiplexed.

When the light is transferred from access waveguide 10 to waveguide 12, the resonance mode is generated in resonator 11. The resonant wavelength of resonator 11 is a wavelength at which a change in phase of light is $2\pi n$ (n is an integer)

when the light makes one round of loop mirror 20 and loop mirror 25. Light having the resonant wavelength is transferred from waveguide 12 to access waveguide 10. As indicated by an arrow A2 in FIG. 1, the light is reflected toward end portion 10a. As indicated by an arrow A3 in FIG. 1, light having wavelengths other than the resonant wavelengths is emitted from end portion 10b. A portion of the light having the resonant wavelength is transferred from loop waveguide 26 to loop waveguide 32 of output section 30 through multiplexer/demultiplexer 31.

The light propagating counterclockwise in loop waveguide 26 is transferred through multiplexer/demultiplexer 31 to loop waveguide 32 with a phase delay of $\pi/2$, and propagates clockwise through loop waveguide 32. The light propagating clockwise in loop waveguide 26 is transferred through multiplexer/demultiplexer 31 to loop waveguide 32 with a phase delay of $\pi/2$, and propagates counterclockwise through loop waveguide 32. The distribution ratio of the light intensity in multiplexer/demultiplexer 31 is, for example, 1:1.

The light propagating through loop waveguide 32 is distributed through multiplexer/demultiplexer 34 to waveguide 36 and waveguide 38. The light propagating clockwise in loop waveguide 32 is input to waveguide 38 with no phase change and to waveguide 36 with a phase change of $\pi/2$. The light propagating counterclockwise in loop waveguide 32 is input to waveguide 38 with a phase change of $\pi/2$ and to waveguide 36 with no phase change. The light that propagates clockwise through loop waveguide 32 and is input to waveguide 38 and the light that propagates counterclockwise through loop waveguide 32 and is input to waveguide 38 have opposite phases. These lights cancel each other out. The light propagated counterclockwise through loop waveguide 32 and input to waveguide 36 and the light propagated clockwise through loop waveguide 32 and input to waveguide 36 are in the same phase. These lights are multiplexed.

By inputting light to access waveguide 10, the resonance mode can be excited in resonator 11. The resonance mode of resonator 11 does not propagate to waveguide 14, but propagates through waveguide 12. The resonance mode is reflected into access waveguide 10. Some of the resonance modes are transferred to output section 30. The resonance modes are cancelled in waveguide 38. The resonance mode propagates through waveguide 36. The resonance mode is emitted from end portion 36a to the outside of optical filter 100.

As indicated by the arrow A4, when light is incident on access waveguide 16, the resonance mode is excited in resonator 13. The resonance mode of resonator 13 does not propagate to waveguide 12, but propagates through waveguide 14. As indicated by an arrow A5, the resonance mode is reflected into access waveguide 16. As indicated by an arrow A6, light having wavelengths other than the resonant wavelengths is transmitted through access waveguide 16. A portion of the resonance mode is transferred into loop waveguide 32 of output section 30. The resonance mode is cancelled in waveguide 36, and propagates through waveguide 38. As indicated by the arrow A8, the resonance mode is emitted from end portion 38a to the outside of optical filter 100.

The resonance mode of resonator 11 is cancelled in waveguide 38 and propagates through waveguide 36. The resonance mode of resonator 13 is cancelled in waveguide 36 and propagates through waveguide 38. In order to enable the above-mentioned propagation of light, the optical path lengths between one multiplexer/demultiplexer and another multiplexer/demultiplexer should be equal. The optical path length of loop waveguide 26 in a clockwise direction from multiplexer/demultiplexer 28 to multiplexer/demultiplexer 31 is equal to the optical path length of loop waveguide 26 in a counterclockwise direction from multiplexer/demultiplexer 28 to multiplexer/demultiplexer 31. In other words, loop waveguide 26 is bisected by multiplexer/demultiplexer 28 and multiplexer/demultiplexer 31. The optical path length of loop waveguide 32 in the clockwise direction from multiplexer/demultiplexer 31 to multiplexer/demultiplexer 34 is equal to the optical path length of loop waveguide 32 in the counterclockwise direction from multiplexer/demultiplexer 31 to multiplexer/demultiplexer 34. In other words, loop waveguide 32 is bisected by multiplexer/demultiplexer 31 and multiplexer/demultiplexer 34.

With respect to the X-axis, a shape of the multiplexer/demultiplexer 24 is symmetrical, a shape of the multiplexer/demultiplexer 28 is symmetrical, and a shape of the waveguide 12 and a shape of the waveguide 14 are symmetrical to each other. That is, the shape of the multiplexer/demultiplexer 24 is linearly symmetrical with a straight line parallel to the X-axis and passing through a center of the multiplexer/demultiplexer 24. the shape of the multiplexer/demultiplexer 28 is linearly symmetrical with a straight line parallel to the X-axis and passing through a center of the multiplexer/demultiplexer 28. The shapes of the waveguide 12 and the waveguide 14 are linearly symmetrical with a straight line parallel to the X-axis and passing through an intermediate point between waveguide 12 and waveguide 14. In this case, the resonant wavelength of resonator 11 and the resonant wavelength of resonator 13 match each other in principle. The FSR (Free Spectral Range) of resonator 11 and the FSR of resonator 13 match each other in principle. When the resonant wavelength and the FSR of one of the resonance mode of resonator 11 and the resonance mode of resonator 13 are known, the resonant wavelength and the FSR of the other can also be known. The shape of multiplexer/demultiplexer 24 may be point-symmetric with respect to the center of multiplexer/demultiplexer 24 itself. The shape of multiplexer/demultiplexer 28 may be point-symmetric with respect to the center of multiplexer/demultiplexer 28 itself.

(Characteristics)

Figure 2A:
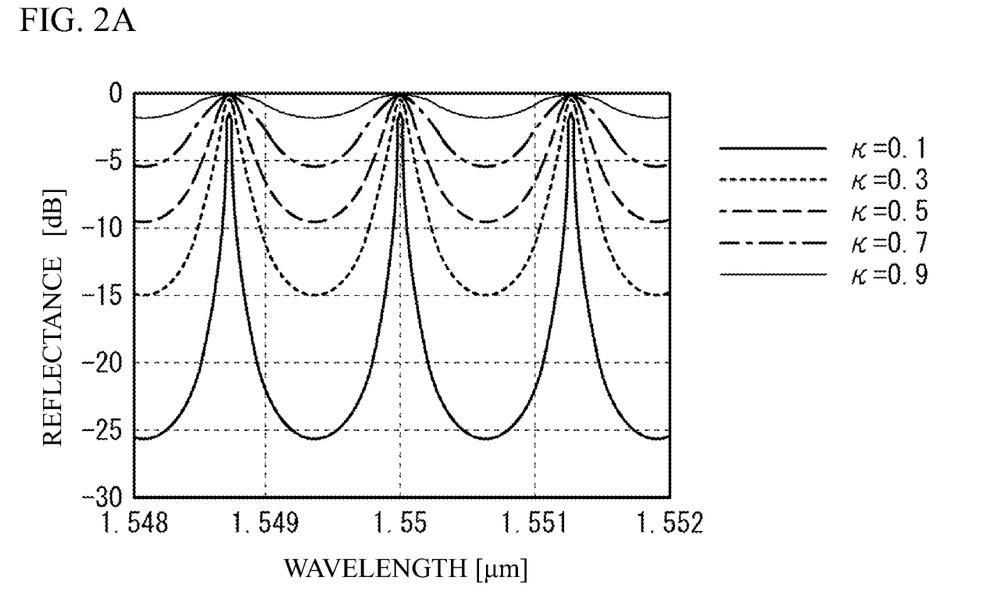
FIG. 2A illustrates characteristics of an optical filter.
Figure 2B:
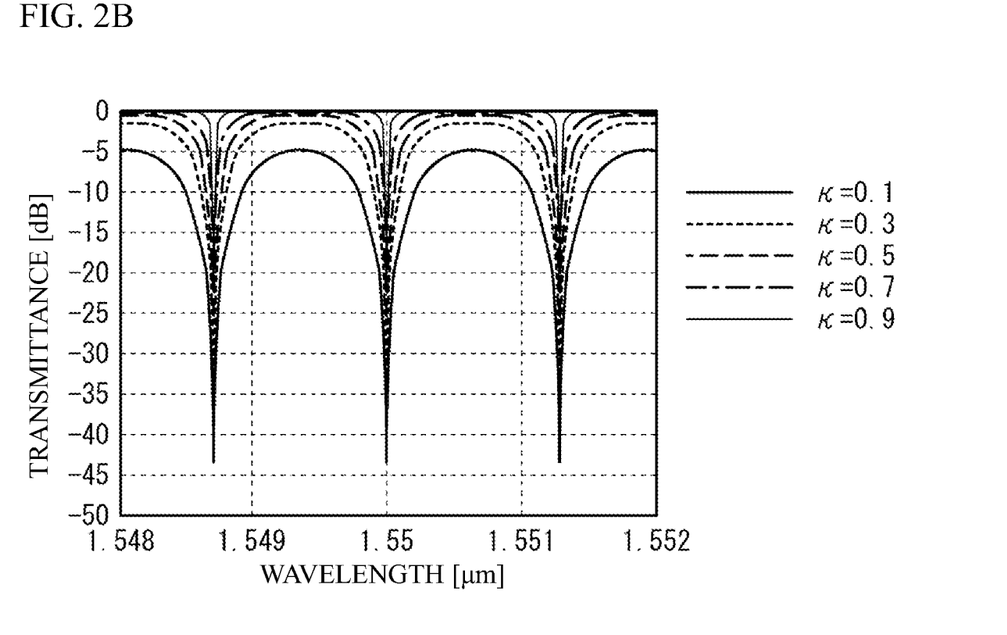
FIG. 2B illustrates characteristics of an optical filter.

FIGS. 2A and 2B illustrate characteristics of optical filter 100. A vertical axis of FIG. 2A represents a reflectance. The reflectance is acquired based on an intensity of the incident light and an intensity of the reflected light to access waveguide 10. A vertical axis of FIG. 2B represents a transmittance. The transmittance is acquired based on an intensity of incident light and an intensity of transmitted light to access waveguide 10. Horizontal axes in FIGS. 2A and 2B represent the wavelength of light. The lines in FIGS. 2A and 2B represent different examples of a coupling coefficient κ. A thick solid line is an example of κ=0.1. A dotted line is an example of κ=0.3. A dashed line is an example where κ=0.5. An alternate long and short dash line is an example of κ=0.7. A thin solid line is an example of κ=0.9.

As illustrated in FIG. 2A, the reflectance reaches a maximum at three resonant wavelengths of resonator 11. As illustrated in FIG. 2B, the transmission reaches a minimum at three resonant wavelengths. The widths of a reflectance peak and a transmittance peak are determined by the coupling coefficient κ between access waveguide 10 and waveguide 12. The lower the coupling coefficient, the narrower and sharper the widths of peaks of reflectance and transmittance. The higher the coupling coefficient, the broader and gentler the widths of the peaks.

The coupling coefficient between access waveguide 10 and waveguide 12 depends on a distance between access waveguide 10 and waveguide 12. When the distance between access waveguide 10 and waveguide 12 is reduced, the coupling coefficient between access waveguide 10 and waveguide 12 increases, and a Q value of resonator 11 decreases. The peaks of the reflectance and the transmittance are broadened. When the distance between access waveguide 10 and waveguide 12 is increased, the coupling coefficient between access waveguide 10 and waveguide 12 is decreased and the Q value is increased. The peaks of the reflectance and the transmittance are narrowed.

Access waveguide 16 also has a reflection characteristic similar to that of FIG. 2A and a transmission characteristic similar to that of FIG. 2B. The coupling coefficient between access waveguide 16 and waveguide 14 may be equal to, greater than, or less than the coupling coefficient between access waveguide 10 and waveguide 12.

As described above, the resonance mode of resonator 11 is transferred to output section 30 and propagates through waveguide 36. The resonance mode of resonator 13 is transferred to output section 30 and propagates through waveguide 38. The intensity of the light propagating in waveguide 36 and the intensity of the light propagating in waveguide 38 exhibits peaks at the resonant wavelength as in FIG. 2A. That is, the light of the resonant wavelength can be extracted with high intensity from waveguide 36 and waveguide 38 of output section 30.

According to the first embodiment, optical filter 100 includes access waveguide 10, access waveguide 16, waveguide 12, waveguide 14, loop mirror 20, loop mirror 25, and output section 30. Waveguide 12 is optically coupled to loop mirror 20 and loop mirror 25 to constitute resonator 11. Waveguide 14 is optically coupled to loop mirror 20 and loop mirror 25 to constitute resonator 13.

The light incident on access waveguide 10 is transferred to waveguide 12, and the resonance mode of resonator 11 is excited. A part of the light propagating through resonator 11 is transferred from loop waveguide 26 to loop waveguide 32 of output section 30, and is emitted from waveguide 36. The light incident on access waveguide 16 is transferred to waveguide 14, and the resonance mode of resonator 13 is excited. A part of the light propagating through resonator 13 is transferred from loop waveguide 26 to loop waveguide 32 of output section 30, and is emitted from waveguide 38. The light of the resonant wavelength can be extracted from output section 30. By observing the emitted light from waveguide 36 and waveguide 38, characteristics such as the resonant wavelength and the FSR of optical filter 100 can be directly measured.

For example, the emitted light from waveguide 36 and waveguide 38 is received by a light receiving element such as a photodiode while changing the wavelength of the light incident on access waveguide 10 and access waveguide 16. The wavelength at which the intensity of light is maximized is the resonant wavelength. An interval between two resonant waves (FSR) can also be measured.

The characteristics of optical filter 100 may change due to a change in a refractive index or the like of the optical waveguide over time. The emitted light from waveguide 36 and waveguide 38 can be used to directly measure changes in the characteristics of optical filter 100 over time, such as shifts in resonant wavelengths.

Light is also emitted from end portion 10b of access waveguide 10 and end portion 16b of access waveguide 16. The emitted light in end portion 10b and end portion 16b is quenched at the resonant wavelength. The emitted light has high intensity at wavelengths other than the resonant wavelengths. The emitted light from waveguide 36 and waveguide 38 has a higher intensity at the resonant wavelength than at wavelengths other than the resonant wavelength. By detecting the emitted light from waveguide 36 and waveguide 38, characteristics such as resonant wavelength can be directly measured.

From multiplexer/demultiplexer 31 to multiplexer/demultiplexer 34, the optical path length of loop waveguide 32 along the clockwise direction is equal to the optical path length of loop waveguide 32 along the counterclockwise direction. In other words, loop waveguide 32 is bisected by multiplexer/demultiplexer 31 and multiplexer/demultiplexer 34. The phases of the light propagating through bisected loop waveguide 32 match each other. The resonance mode of resonator 11 is cancelled in waveguide 38 and propagates through waveguide 36. The resonance mode of resonator 13 is cancelled in waveguide 36 and propagates through waveguide 38. The resonance modes of the two resonators 11 and 13 can be separated and extracted. The resonant wavelength and the FSR of resonator 11 can be measured by using the emitted light from waveguide 36. The resonant wavelength and the FSR of resonator 13 can be measured using the emitted light from waveguide 38.

From multiplexer/demultiplexer 28 to multiplexer/demultiplexer 31, the optical path length of loop waveguide 26 along the clockwise direction is equal to the optical path length of loop waveguide 26 along the counterclockwise direction. In other words, loop waveguide 26 is bisected by multiplexer/demultiplexer 28 and multiplexer/demultiplexer 31. The phases of the light propagating through bisected loop waveguide 26 match each other. By equalizing the optical path lengths of loop waveguide 26 and loop waveguide 32 between multiplexer/demultiplexer 28 and multiplexer/demultiplexer 31, the phases of the light propagating through loop waveguide 26 and loop waveguide 32 match each other. The resonance mode of resonator 11 is cancelled in waveguide 38 and propagates through waveguide 36. The resonance mode of resonator 13 is cancelled in waveguide 36 and propagates through waveguide 38. The resonance modes of resonator 11 and resonator 13 can be separated and extracted.

In the Y-axis direction where waveguide 12 and waveguide 14 are disposed, the shape of waveguide 12 is symmetrical with the shape of waveguide 14. The shape of multiplexer/demultiplexer 24 is symmetrical. The shape of multiplexer/demultiplexer 28 is symmetrical. That is, the shapes of the waveguide 12 and the waveguide 14 are linearly symmetrical with a straight line parallel to the Y-axis and passing through intermediate points between waveguide 12 and waveguide 14. The shape of the multiplexer/demultiplexer 24 is linearly symmetrical with a straight line parallel to the Y-axis and passing through a center of the multiplexer/demultiplexer 24. the shape of the multiplexer/demultiplexer 28 is linearly symmetrical with a straight line parallel to the Y-axis and passing through a center of the multiplexer/demultiplexer 28. The resonant wavelength of the resonance mode of resonator 11 matches the resonant wavelength of the resonance mode of resonator 13. The FSR of the resonance mode of resonator 11 matches the FSR of the resonance mode of resonator 13. For example, by measuring the resonant wavelength and the FSR of the resonance mode of resonator 13 using the emitted light from waveguide 38, the resonant wavelength and the FSR of the resonance mode of resonator 11 can also be measured. The emitted light from waveguide 36 can be used for purposes other than measuring characteristics. The shape of multiplexer/demultiplexer 24 may be point-symmetric with respect to the center of multiplexer/demultiplexer 24 itself. The shape of multiplexer/demultiplexer 28 may be point-symmetric with respect to the center of multiplexer/demultiplexer 28 itself.

The shapes of loop waveguide 32 and loop waveguide 26 in FIG. 1 overlap each other with respect to a line passing through the center of loop waveguide 26 and parallel to the Y-axis. The shape of loop waveguide 32 may be different from loop waveguide 26. The optical path length of loop waveguide 32 may be equal to or different from the optical path length of loop waveguide 22 and the optical path length of loop waveguide 26. The optical path length of loop waveguide 22 may be equal to or different from the optical path length of loop waveguide 26. The optical waveguide of optical filter 100 may be equipped with an electrode 60 as described below in FIG. 4. Since electrode 60 functions as a heater, the resonant wavelength can be changed.

Figure 3:
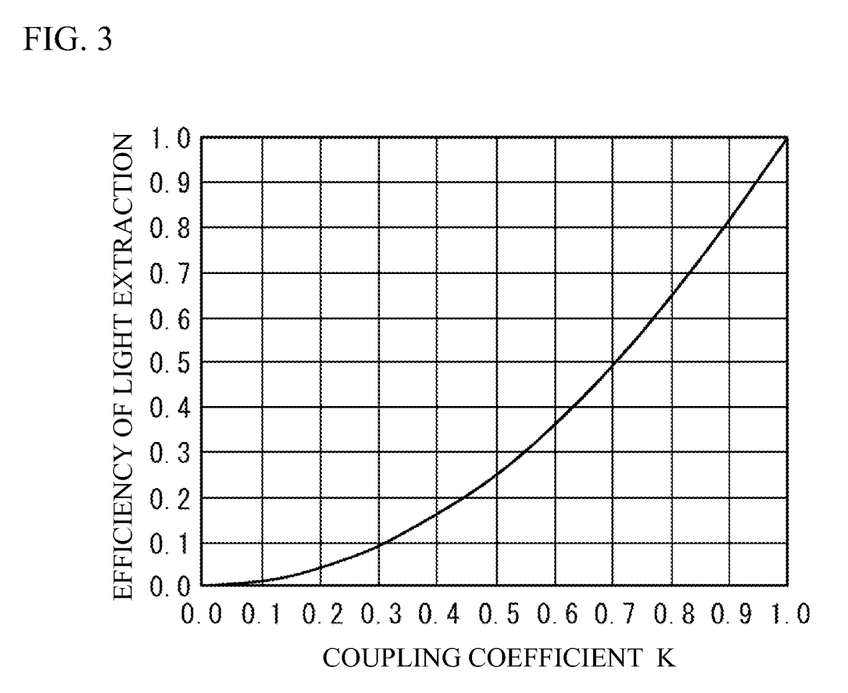
FIG. 3 illustrates the relationship between the coupling coefficient and the efficiency of light extraction.

FIG. 3 illustrates the relationship between the coupling coefficient and the efficiency of light extraction. A horizontal axis represents a coupling coefficient between loop waveguide 26 and loop waveguide 32. A vertical axis is an efficiency of light extraction from loop waveguide 26 to loop waveguide 32. As illustrated in FIG. 3, the efficiency of extraction increases in proportion to the square of the coupling coefficient. The coupling coefficient between loop waveguide 26 and output section 30 depends on the distance between loop waveguide 26 and loop waveguide 32. By adjusting the distance between loop waveguide 26 and loop waveguide 32, the intensity of light that is transferred into loop waveguide 32 of output section 30 can be changed.

Second Embodiment

Figure 4:
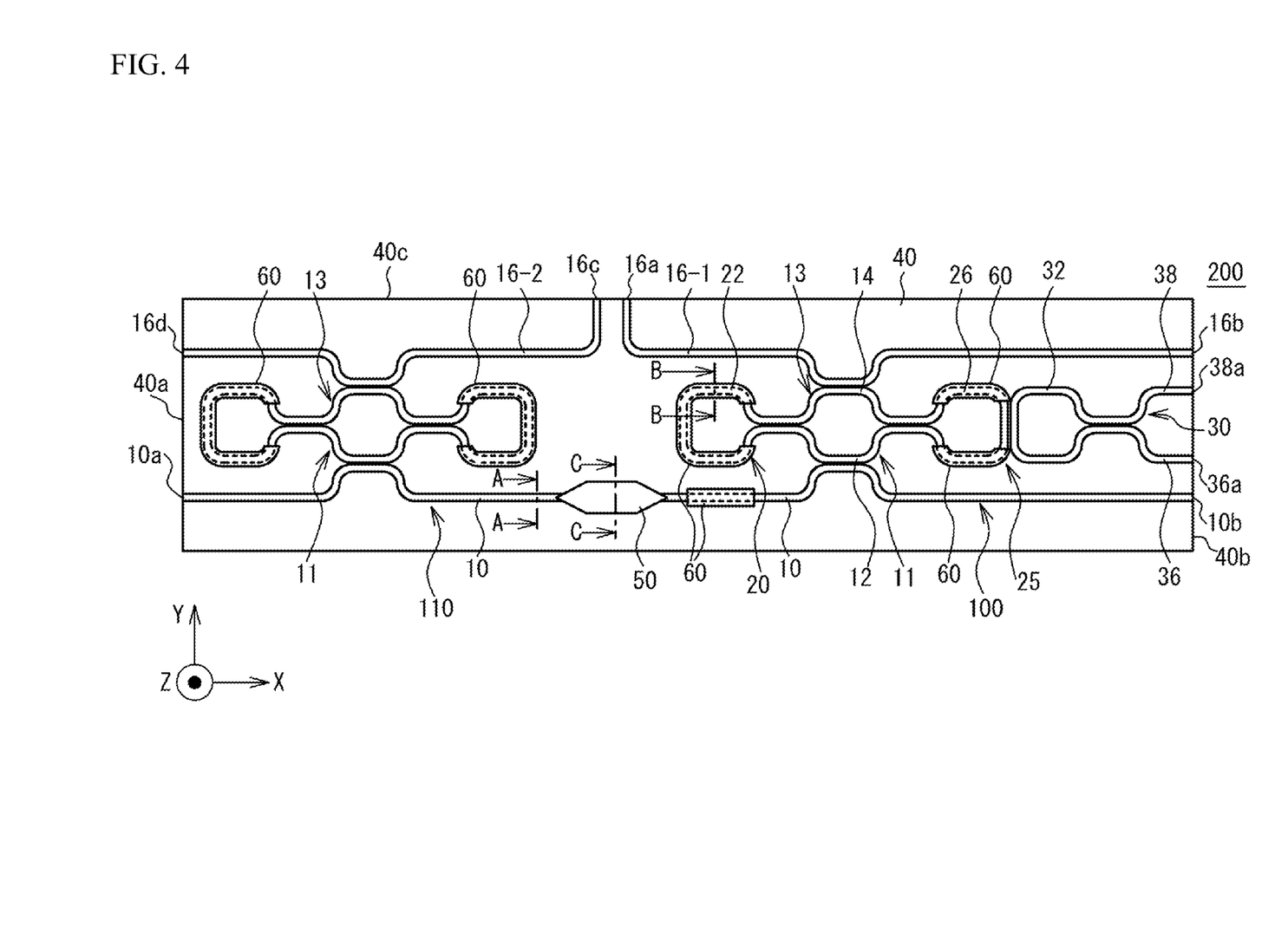
FIG. 4 is a plan view illustrating a wavelength tunable laser element according to a second embodiment.

FIG. 4 is a plan view illustrating a wavelength tunable laser element 200 according to a second embodiment. Wavelength tunable laser element 200 includes optical filter 100, an optical filter 110, and a gain section 50.

Optical filter 100 has the same configuration as illustrated in FIG. 1. Optical filter 110 has a configuration in which output section 30 is removed from optical filter 100. Optical filter 100 and optical filter 110 are formed on substrate 40. Gain section 50 is a light emitting element formed of, for example, a group III-V compound semiconductor. Gain section 50 is bonded to an upper surface of substrate 40.

Optical filter 100 and optical filter 110 share access waveguide 10. End portion 10a is positioned at end portion 40a. End portion 10b is positioned at end portion 40b.

Substrate 40 has an end portion 40c. End portion 40c is one of two sides (end portions of substrate 40) extending along the X-axis of substrate 40. End portion 16a of an access waveguide 16-1 of optical filter 100 is positioned at end portion 40c. End portion 16b of access waveguide 16-1 is positioned at end portion 40b of substrate 40. An end portion 16c of an access waveguide 16-2 of optical filter 110 is positioned at end portion 40c. An end portion 16d of access waveguide 16-2 is positioned at end portion 40a. End portion 10a, end portion 16a, and end portion 16c function as incident ports. End portion 36a and end portion 38a are positioned in end portion 40b. End portion 36a and an end portion 36b function as emission ports.

Each of optical filters 100 and 110 include a plurality of electrodes 60. Electrodes 60 are disposed on loop waveguide 22, loop waveguide 26, and access waveguide 10 in each of optical filters 100 and 110. Electrode 60 is made of metal. Electrode 60 functions as a heater. When a current is input to electrode 60, electrode 60 generates heat. When electrode 60 generates heat, the refractive index of the optical waveguide changes, thereby changing the phase of light propagating through the optical waveguide. The resonant wavelength can be changed by changing the phase of the light.

Figure 5A:
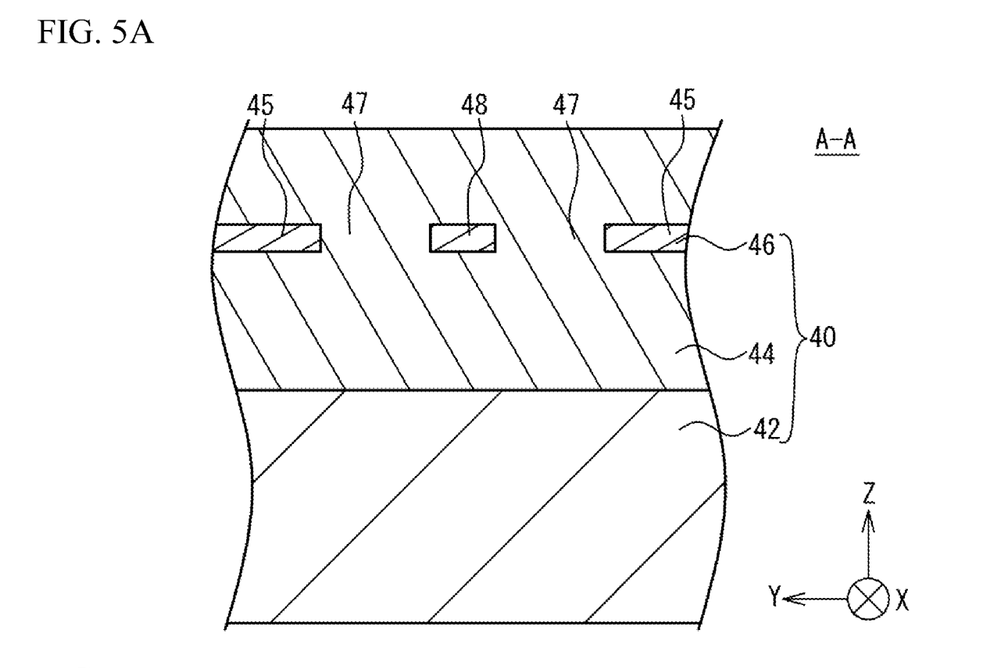
FIG. 5A is a cross-sectional view taken along line A-A of FIG. 4.
Figure 5B:
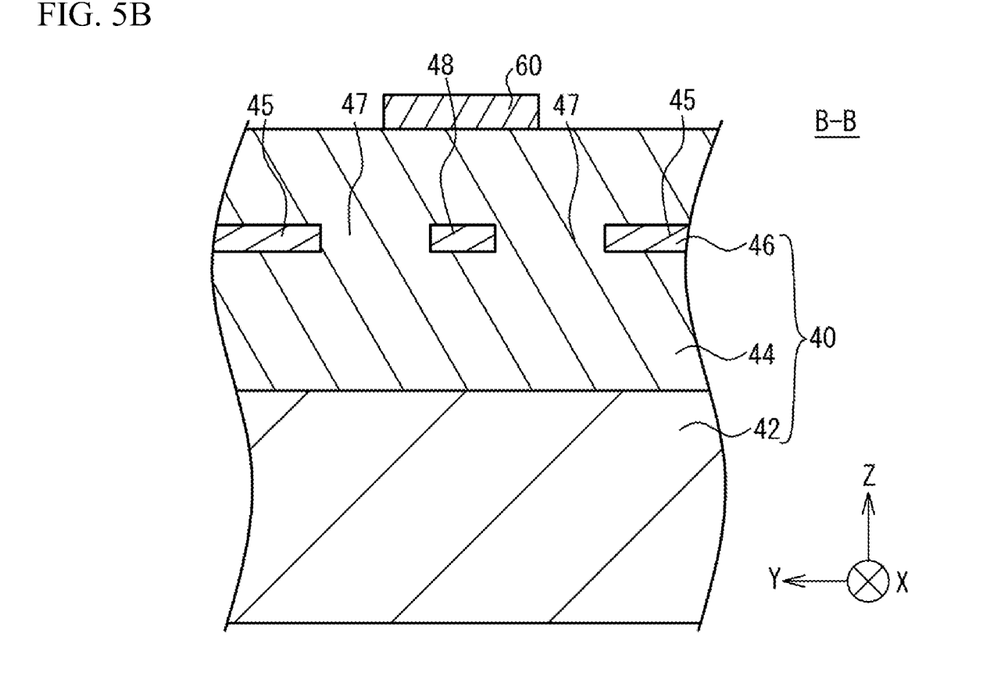
FIG. 5B is a cross-sectional view taken along line B-B of FIG. 4.

FIG. 5A is a cross-sectional view taken along line A-A of FIG. 4, and illustrates a cross-section of access waveguide 10. FIG. 5B is a cross-sectional view taken along line B-B of FIG. 4 and illustrates a cross-section of loop waveguide 22. As illustrated in FIGS. 5A and 5B, substrate 40 is an SOI (Silicon on Insulator) substrate and includes a substrate 42, a cladding layer 44 (box layer) and a silicon (Si) layer 46. Substrate 42 is made of, for example, Si. Cladding layer 44 is made of, for example, silicon oxide ($SiO_2$).

Cladding layer 44 is layered on an upper surface of substrate 42. An Si layer 46 is buried inside cladding layer 44. Si layer 46 is separated from the upper surface of substrate 42. The distance between Si layer 46 and the upper surface of substrate 42 is, for example, 3 μm. Si layer 46 includes a terrace 45 and a waveguide core 48. Terrace 45 is extending in the XY plane. Waveguide core 48 is separated from the Si layer 46 in the XY plane. The thickness of waveguide core 48 is, for example, 0.22 μm. The width of waveguide core 48 is, for example, 0.42 μm.

Figure 5C:
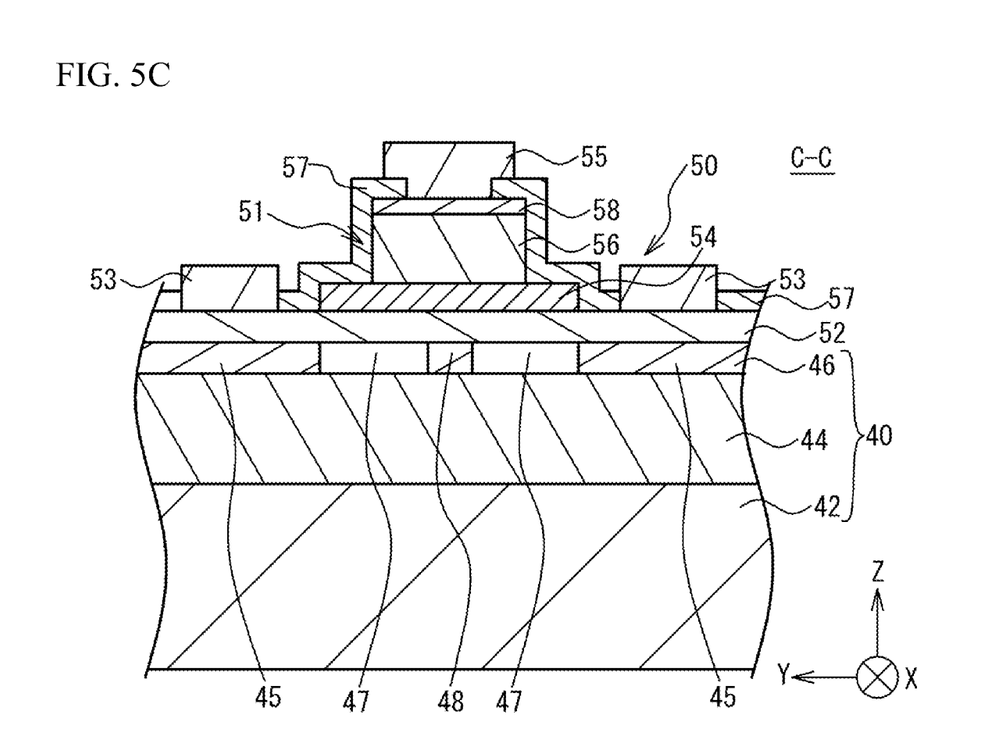
FIG. 5C is a cross-sectional view taken along line C-C of FIG. 4.

A groove 47 is disposed between waveguide core 48 and terrace 45. Grooves 47 are positioned on both side of waveguide core 48. Grooves 47 extend in the same direction as waveguide core 48. The inside of grooves 47 is filled with $SiO_2$. In FIGS. 5A to 5C, grooves 47 are a portion where Si is not disposed. Grooves 47 may be, for example, a portion of the Si layer 46 that is recessed from terrace 45. As illustrated in FIG. 5B, electrode 60 is disposed on an upper surface of cladding layer 44. Electrode 60 is positioned above waveguide core 48 along the Z-axis.

A part of the optical waveguide of wavelength tunable laser element 200 where electrode 60 is not disposed has the same configuration as that of FIG. 5A. A part of the optical waveguide of wavelength tunable laser element 200 where electrode 60 is disposed has the same configuration as that of FIG. 5B.

As illustrated in FIG. 4, gain section 50 is positioned at the boundary between optical filter 100 and optical filter 110. Further, gain section 50 is positioned above access waveguide 10. Gain section 50 is optically coupled to access waveguide 10. Both end portions of gain section 50 along the X-axis are tapered.

FIG. 5C is a cross-sectional view taken along line C-C of FIG. 4 and illustrates a cross-section of gain section 50. In the portion of substrate 40 to which gain section 50 is bonded, cladding layer 44 is disposed between substrate 42 and the Si layer 46. Cladding layer 44 is not disposed on the Si layer 46.

Gain section 50 includes a cladding layer 52, a cladding layer 56, an active layer 54, and a contact layer 58. Cladding layer 52 is bonded to the Si layer 46. A lower surface of cladding layer 52 is in contact with an upper surface of the Si layer 46. Active layer 54, cladding layer 56, and contact layer 58 are deposited on cladding layer 52 in that order. A mesa 51 is composed of active layer 54, cladding layer 56, and contact layer 58. Mesa 51 is positioned on waveguide core 48 of substrate 40. Cladding layer 52 extends outside mesa 51.

An upper surface of cladding layer 52 and side and upper surfaces of mesa 51 are covered with an insulation film 57. Insulation film 57 has openings on cladding layer 52 and mesa 51. An electrode 53 is disposed on cladding layer 52. Electrode 53 contacts the upper surface of cladding layer 52 through the opening of insulation film 57. An electrode 55 is disposed on mesa 51. Electrode 55 contacts the upper surface of contact layer 58 through the opening of insulation film 57.

Cladding layer 52 is composed of, for example, n-type indium phosphide (InP). Active layer 54 is composed of, for example, aluminum gallium indium arsenide (AlGaInAs). Active layer 54 has a multiple quantum well structure (MQW). Cladding layer 56 is composed of, for example, p-type InP. Contact layer 58 is composed of, for example, p-type indium gallium arsenide (InGaAs). Electrode 53 is made of a metal such as a layered body of gold, germanium, and nickel (Au/Ge/Ni). Electrode 55 is composed of, for example, a metal such as a layered body of titanium, platinum, and gold (Ti/Pt/Au).

A sum of optical path lengths of the two loop mirrors of optical filter 100 is different from a sum of optical path lengths of the two loop mirrors of optical filter 110. The FSR of optical filter 100 is different from the FSR of optical filter 110.

Figure 6A:
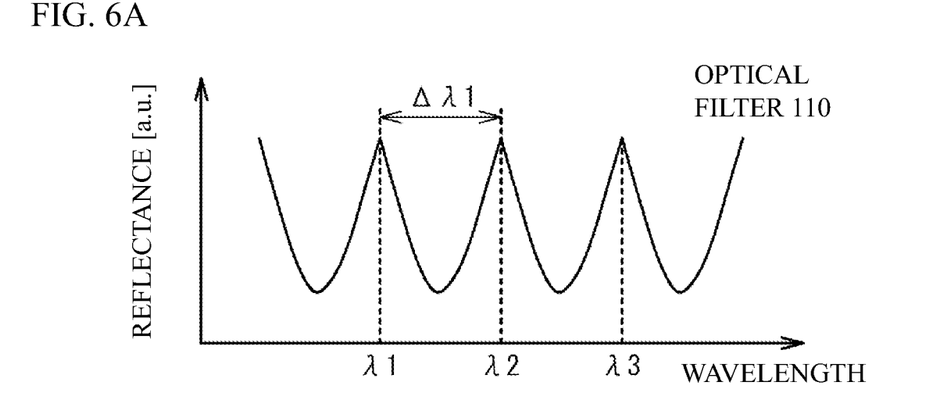
FIG. 6A is a diagram illustrating reflection characteristics of an optical filter.
Figure 6B:
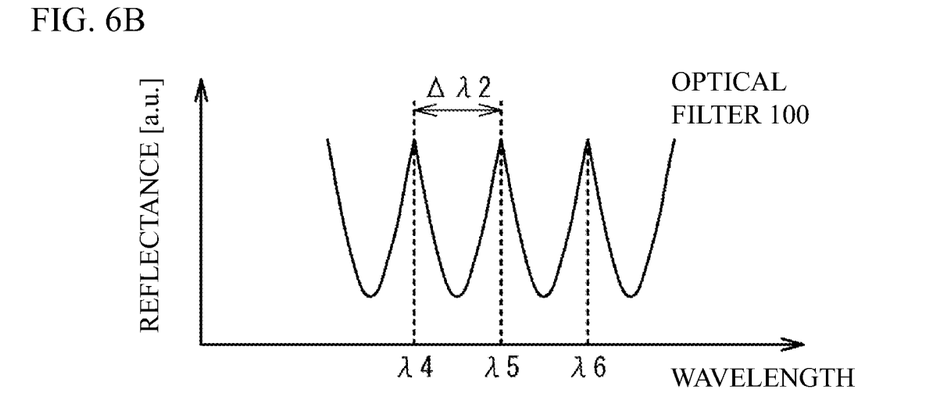
FIG. 6B is a diagram illustrating reflection characteristics of an optical filter.

FIG. 6A is a diagram illustrating reflection characteristics of optical filter 110. FIG. 6B is a diagram illustrating reflection characteristics of optical filter 100. A horizontal axis represents a wavelength of light. A vertical axis represents a reflectance.

As illustrated in FIG. 6A, the reflectance of optical filter 110 exhibits peaks at resonant wavelengths $\lambda 1$, $\lambda 2$, and $\lambda 3$. The interval (FSR) between two adjacent resonant wavelengths is $\Delta\lambda 1$. As illustrated in FIG. 6B, the reflectance of optical filter 100 exhibits peaks at resonant wavelengths $\lambda 4$, $\lambda 5$, and $\lambda 6$. The interval (FSR) between two adjacent resonant wavelengths is $\Delta\lambda 2$, which is smaller than $\Delta\lambda 1$. Laser oscillation is performed by utilizing a vernier effect of two optical filters 100 and 110.

Gain section 50 has an optical gain. A current is applied into mesa 51 from electrode 53 and electrode 55. When carriers are injected into active layer 54, active layer 54 generates light. Light is emitted from both ends of gain section 50. The light emitted from the first end portion of gain section 50 propagates through access waveguide 10 and is input to optical filter 110. The light emitted from the second end portion of gain section 50 propagates through access waveguide 10 and is input to optical filter 100.

When light is input from access waveguide 10 to optical filter 110, the resonance mode of resonator 11 is excited. Light having the resonant wavelength is reflected and propagates through access waveguide 10 toward gain section 50. Light having the resonant wavelength is also reflected from optical filter 100. The light propagates through access waveguide 10 towards gain section 50.

When the light is repeatedly reflected by optical filter 100 and optical filter 110, wavelength tunable laser element 200 performs laser oscillation. The wavelength at which the resonant wavelength of optical filter 100 matches the resonant wavelength of optical filter 110 is the oscillation wavelength.

Figure 6C:
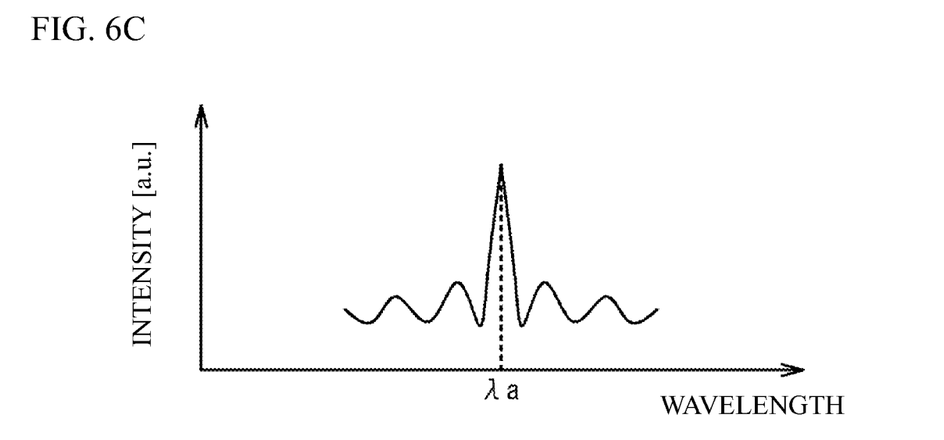
FIG. 6C is a diagram illustrating the intensity of laser light.

FIG. 6C is a diagram illustrating the intensity of laser light. A horizontal axis represents the wavelength of light. A vertical axis represents light intensity. When one of the plurality of resonant wavelengths in FIG. 6A (for example, $\lambda 2$) and one of the plurality of resonant wavelengths in FIG. 6B (for example, $\lambda 5$) match each other, laser light is generated at that wavelength. As illustrated in FIG. 6C, the wavelength $\lambda a$ ($=\lambda 2=\lambda 5$) is the oscillation wavelength, and high-intensity laser light is oscillated.

The laser light propagates through access waveguide 10. The laser light is transferred from access waveguide 10 to waveguide 12 of optical filter 100. The laser light propagates through loop mirror 20 and loop mirror 25. A part of the laser light is transferred from loop waveguide 26 to loop waveguide 32. The laser light propagating through loop waveguide 32 is cancelled in waveguide 38. The laser light transferred from loop waveguide 32 to waveguide 36 is emitted to the outside from end portion 36a.

Light is incident on access waveguide 16-1 through end portion 16a illustrated in FIG. 4 from a light source external to wavelength tunable laser device 200. Light is incident on access waveguide 16-2 through end portion 16c from the light source external to wavelength tunable laser device 200. The resonances mode of resonator 13 is excited in optical filter 100 and optical filter 110 are excited. The light having the resonant wavelength is reflected by optical filter 100, propagates through access waveguide 16-1, and is emitted to the outside from end portion 16a. The light having the resonant wavelength is reflected by optical filter 110, propagates through access waveguide 16-2, and is emitted to the outside from end portion 16c. Light (transmitted light) having a wavelength other than the resonant wavelength propagates through access waveguide 16-1. The transmitted light is emitted to the outside from end portion 16b. The transmitted light propagates through access waveguide 16-2. The transmitted light is emitted to the outside from end portion 16d.

A part of the resonance mode generated in resonator 13 of optical filter 100 is transferred to output section 30 and is cancelled in waveguide 36. The part of the resonance mode propagates through waveguide 38 and is emitted to the outside from end portion 38a.

According to the second embodiment, gain section 50 is optically coupled to optical filter 100 and optical filter 110. The emitted light from gain section 50 is reflected by optical filter 100 and optical filter 110. The FSR of optical filter 100 is different from the FSR of optical filter 110. The laser light is oscillated by the vernier effect of optical filter 100 and optical filter 110. A part of the laser light transitions to output section 30 of optical filter 100 and is emitted from waveguide 36. When light is incident on access waveguide 16-1, the resonance mode is excited in resonator 13 of optical filter 100. The light having the resonant wavelength transitions to output section 30 and is emitted from waveguide 38.

Light can be extracted from waveguide 36 and waveguide 38 to the outside of wavelength tunable laser element 200. The laser light is emitted from waveguide 36. The laser light emitted from waveguide 36 can be used for, for example, optical communication. Light having a high intensity at the resonant wavelength is emitted from waveguide 38. The emitted light from waveguide 38 is used to measure the characteristics of optical filter 100. An amount of light extracted from waveguide 36 and waveguide 38 depends on the coupling coefficient between loop waveguide 26 and loop waveguide 32 as illustrated in FIG. 3. By reducing the distance between loop waveguide 26 and loop waveguide 32, the coupling coefficient can be increased and the intensity of the emitted light can be increased. For example, the distance between the loop waveguides is determined so that the intensity of light reflected to gain section 50 and the intensity of light emitted to the outside from waveguide 36 have appropriate magnitudes.

Light is also emitted from end portion 10a of access waveguide 10 and end portion 16d of access waveguide 16-2. The emitted light from end portion 16d can be used to measure the characteristics of optical filter 110. The wavelength at which the emitted light is quenched is the resonant wavelength of optical filter 110.

By applying a current to electrode 60, the refractive index of the optical waveguide changes to adjust the phase of light. The resonant wavelengths of optical filter 100 and optical filter 110 change due to the change in phase. The spectra illustrated in FIGS. 6A and 6B can be shifted. The oscillation wavelength can be changed from λa illustrated in FIG. 6C. As described above, wavelength tunable laser element 200 can change the oscillation wavelength of the laser light.

It is effective to dispose electrode 60 in loop waveguide 22 and loop waveguide 26 of the optical filter. By heating the loop waveguide with electrode 60, the refractive index of the loop waveguide changes. By changing the refractive index, the optical path length is changed. The resonant wavelengths of resonator 11 and resonator 13 can be controlled by changing the optical path length. Electrode 60 may be positioned on at least one of loop waveguide 22 and loop waveguide 26 of the optical filter. Electrode 60 may be positioned at a position other than that illustrated in FIG. 4. The configuration for adjusting the phase of the light may be other than electrode 60.

The optical waveguides of optical filter 100 and optical filter 110 have waveguide core 48 of Si. Waveguide core 48 is surrounded by cladding layer 44 of $SiO_2$. The refractive index of Si is about 3.5. The refractive index of $SiO_2$ is about 1.4. Light can be strongly confined in waveguide core 48 which has a higher refractive index than cladding layer 44. Loss of light in a bent optical waveguide such as an access waveguide or a loop waveguide is suppressed.

Gain section 50, optical filter 100, and optical filter 110 may be monolithically integrated on a compound semiconductor substrate. The optical waveguide has a high mesa structure including, for example, a group III-V compound semiconductor. Optical filter 110 of wavelength tunable laser element 200 may be configured to reflect light. For example, a filter other than optical filter 110, a reflecting mirror, or the like may be used as a configuration (reflector) for reflection. Gain section 50 is disposed between optical filter 100 and the reflector. The emitted light from one end portion of gain section 50 is reflected by optical filter 100, and the emitted light from the other end portion is reflected by the reflector, thereby enabling laser oscillation. By disposing optical filter 100 on the light extraction side, high-intensity light can be emitted.

Although the embodiments of the present disclosure have been described in detail, the present disclosure is not limited to the specific embodiments, and various modifications and changes can be made within the scope of the present disclosure described in the claims.

What is claimed is:

1. An optical filter comprising:
a first loop mirror;
a second loop mirror;
a first waveguide optically coupled to the first loop mirror and the second loop mirror;
a second waveguide optically coupled to the first loop mirror and the second loop mirror;
a first access waveguide optically coupled to the first waveguide;
a second access waveguide optically coupled to the second waveguide; and
an output section,
wherein the first loop mirror includes a first loop waveguide and a first multiplexer/demultiplexer,
wherein the second loop mirror includes a second loop waveguide and a second multiplexer/demultiplexer,
wherein the first loop waveguide is optically coupled to the first multiplexer/demultiplexer,
wherein the second loop waveguide is optically coupled to the second multiplexer/demultiplexer,
wherein the first waveguide is optically coupled to the first multiplexer/demultiplexer and the second multiplexer/demultiplexer,
wherein the second waveguide is optically coupled to the first multiplexer/demultiplexer and the second multiplexer/demultiplexer,
wherein the output section includes a third loop waveguide, a third multiplexer/demultiplexer, a third waveguide, and a fourth waveguide,
wherein the third loop waveguide is optically coupled to the second loop waveguide and the third multiplexer/demultiplexer, and
wherein the third waveguide and the fourth waveguide are optically coupled to the third multiplexer/demultiplexer.

2. The optical filter according to claim 1,
wherein the output section includes a fourth multiplexer/demultiplexer,
wherein the fourth multiplexer/demultiplexer is optically coupled to the second loop waveguide and the third loop waveguide, and
wherein, from the third multiplexer/demultiplexer to the fourth multiplexer/demultiplexer, an optical path length of the third loop waveguide in a clockwise direction of the third loop waveguide is equal to an optical path length of the third loop waveguide in a counterclockwise direction of the third loop waveguide.

3. The optical filter according to claim 2, wherein, from the second multiplexer/demultiplexer to the fourth multiplexer/demultiplexer, an optical path length of the second loop waveguide in a clockwise direction of the second loop waveguide is equal to an optical path length of the second loop waveguide in a counterclockwise direction of the second loop waveguide.

4. The optical filter according to claim 1, wherein a shape of the first multiplexer/demultiplexer is symmetrical, a shape of the second multiplexer/demultiplexer is symmetrical, a shape of the third multiplexer/demultiplexer is symmetrical, and a shape of the first waveguide and a shape of the second waveguide are symmetrical to each other.

5. The optical filter according to claim 1, wherein the first waveguide, the second waveguide, the third waveguide, the fourth waveguide, the first loop waveguide, the second loop waveguide, the third loop waveguide, the first access waveguide, and the second access waveguide are made of silicon.

6. The optical filter according to claim 1, comprising a phase adjusting section disposed in at least one of the first loop waveguide and the second loop waveguide, the phase adjusting section being configured to adjust a phase of light propagating in the at least one of the first loop waveguide and the second loop waveguide.

7. A wavelength tunable laser element comprising:
a gain section having an optical gain;
the optical filter according to claim 1; and
a reflector configured to reflect light,
wherein the gain section is positioned between the optical filter and the reflector and is optically coupled to the first access waveguide of the optical filter.

* * * * *